United States Patent
Hobbs et al.

(10) Patent No.: US 7,471,078 B2
(45) Date of Patent: Dec. 30, 2008

(54) STIFFENER ASSEMBLY FOR USE WITH TESTING DEVICES

(75) Inventors: Eric D. Hobbs, Livermore, CA (US); Andrew W. McFarland, Dublin, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/617,929

(22) Filed: Dec. 29, 2006

(65) Prior Publication Data

US 2008/0157790 A1 Jul. 3, 2008

(51) Int. Cl.
*G01R 31/28* (2006.01)
*G01R 31/02* (2006.01)

(52) U.S. Cl. .............. 324/158.1; 324/754; 324/758

(58) Field of Classification Search ......... 324/754–765, 324/158.1
See application file for complete search history.

(56) References Cited

U.S. PATENT DOCUMENTS

| | | | | |
|---|---|---|---|---|
| 6,166,553 A * | 12/2000 | Sinsheimer | ............... | 324/754 |
| 6,420,885 B1 * | 7/2002 | Fredrickson | ............... | 324/754 |
| 6,744,267 B2 * | 6/2004 | Sauk et al. | ............... | 324/754 |
| 6,762,612 B2 * | 7/2004 | Yu et al. | ............... | 324/757 |
| 6,853,205 B1 * | 2/2005 | Cheng et al. | ............... | 324/754 |
| 6,894,523 B2 * | 5/2005 | Neeb | ............... | 324/765 |
| 2005/0280428 A1 * | 12/2005 | Ishikawa et al. | ............. | 324/754 |
| 2006/0255814 A1 * | 11/2006 | Eldridge et al. | ............. | 324/754 |
| 2007/0007977 A1 * | 1/2007 | Eldridge et al. | ............. | 324/754 |

OTHER PUBLICATIONS

International Search Report and Written Opinion mailed Sep. 30, 2008 for PCT Appl. No. PCT/US07/86892.

\* cited by examiner

*Primary Examiner*—Ha Tran T Nguyen
*Assistant Examiner*—Joshua Benitez
(74) *Attorney, Agent, or Firm*—Alan M. Taboada

(57) ABSTRACT

A stiffener assembly for use with testing devices is provided herein. In some embodiments, a stiffener for use with testing devices includes an inner member; an outer member disposed in a predominantly spaced apart relation to the inner member; and a plurality of alignment mechanisms for orienting the inner and outer members with respect to each other, wherein the alignment mechanisms transfer forces applied to a lower surface of the inner member to the outer member and provide the predominant conductive heat transfer passageway between the inner and outer members.

21 Claims, 4 Drawing Sheets

STIFFENER ASSEMBLY FOR USE WITH TESTING DEVICES

BACKGROUND OF THE INVENTION

1. Field of the Invention

Embodiments of the present invention generally relate to testing of partially or fully completed semiconductor devices and, more particularly, to stiffener assemblies for use in connection with apparatus for testing such devices.

2. Description of the Related Art

When testing partially or fully completed semiconductor devices formed on a semiconductor substrate, such as integrated circuits and the like, a plurality of contact elements are typically brought into contact with the device to be tested—sometimes referred to as a device under test (or DUT). The contact elements are typically part of a probe card assembly or other similar device coupled to a test mechanism that provides electrical signals to terminals on the DUT in accordance with a predetermined testing protocol.

In order to sufficiently and accurately contact all desired terminals of the DUT during a particular testing protocol, the contact elements disposed on the probe card assembly must be brought into contact with the terminals of the DUT and must maintain alignment therewith. However, various forces applied to the probe card assembly may cause the assembly to deflect in a manner that may cause misalignment of the contact elements. Accordingly, the probe card assembly generally includes stiffening members and/or assemblies designed to minimize such deflection of the probe card assembly.

Generally, such stiffening members or assemblies have relatively large masses to suitably provide the stiffening benefit required during testing. However, such testing often occurs at high temperatures, for example up to about 150 degrees Celsius, thereby requiring increased time for the probe card assembly to reach a steady state suitable to begin testing of the DUT. However, such delays in testing while waiting for the probe card assembly to heat up is costly and reduces availability of the equipment for testing. Moreover, the large mass of the stiffening members or assemblies further exacerbates this problem.

Therefore, there is a need for an improved stiffening element for use in the probe card assembly.

SUMMARY OF THE INVENTION

A stiffener assembly for use with testing devices is provided herein. In some embodiments, a stiffener for use with testing devices includes an inner member; an outer member disposed in a predominantly spaced apart relation to the inner member; and a plurality of alignment mechanisms for orienting the inner and outer members with respect to each other, wherein the alignment mechanisms transfer forces applied to a lower surface of the inner member to the outer member and provide the predominant conductive heat transfer passageway between the inner and outer members.

In some embodiments, a stiffener for use with testing devices includes an inner member and an outer member disposed in a predominantly spaced apart relation, the inner and outer members moveable with respect to each other and coupled together via a plurality of alignment mechanisms that transfer forces applied to lower surfaces of the inner member to the outer member and provide the predominant conductive heat transfer passageway between the inner and outer members.

In some embodiments, a probe card assembly includes a substrate having an upper surface and an opposing lower surface; and a stiffener, including an inner member; an outer member moveably coupled to the substrate and disposed in a predominantly spaced apart relation to the inner member; and a plurality of alignment mechanisms for orienting the inner and outer members with respect to each other, wherein the alignment mechanisms transfer forces applied to a lower surface of the inner member to the outer member and provide the predominant conductive heat transfer passageway between the inner and outer members.

In another aspect of the invention, a method of using a probe card assembly is provided. In some embodiments, a method of using a probe card assembly includes providing a probe card assembly having a stiffener assembly coupled thereto, the stiffener assembly comprising an inner member and an outer member disposed in a predominantly spaced apart relation, the inner and outer members moveable with respect to each other and coupled together via a plurality of alignment mechanisms that transfer forces applied to lower surfaces of the inner member to the outer member and provide the predominant conductive heat transfer passageway between the inner and outer members; and adjusting a plane of the inner member relative to a plane of the outer member via the alignment mechanisms.

BRIEF DESCRIPTION OF THE DRAWINGS

So that the manner in which the above recited features of the present invention and others described below can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Where possible, identical reference numerals are used herein to designate identical elements that are common to the figures. The images used in the drawings are simplified for illustrative purposes and are not necessarily depicted to scale.

DETAILED DESCRIPTION

The present invention provides embodiments of stiffener assemblies and probe card assemblies incorporating the same. Methods of use of the stiffener assembly and the probe card assembly are further provided. The stiffener assembly can advantageously provide stiffening of a substrate used with a probe card assembly while significantly reducing the heat transfer between stiffener assembly components, thereby minimizing the thermal mass of the stiffener assembly that must be heated during testing and reducing heating times to bring the stiffener assembly up to temperature. In some embodiments, an inner portion may also be moved relative to an outer portion to assist in orienting a probing plane with a surface to be probed.

Figure 1:
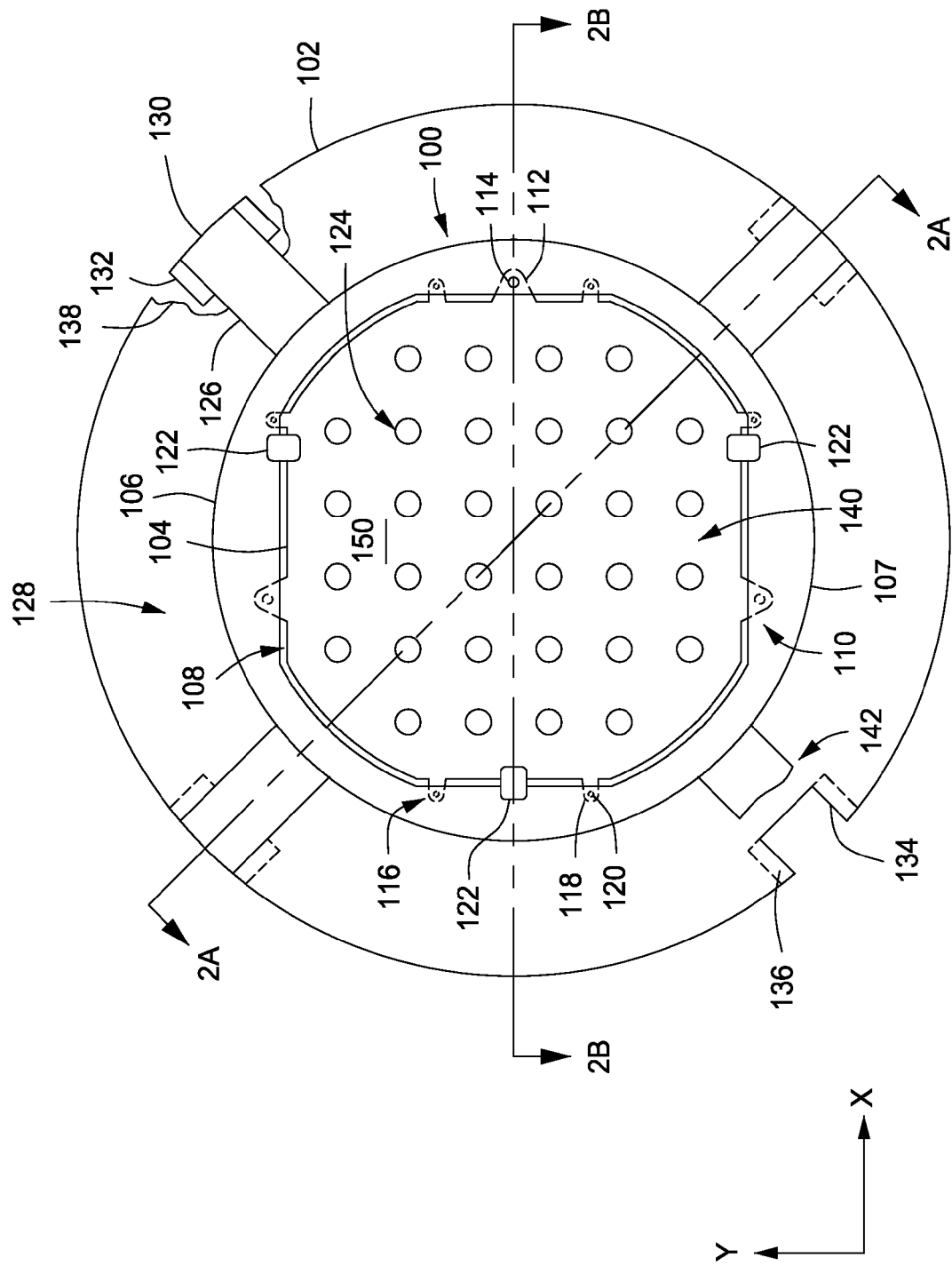
FIG. 1 depicts a schematic top view of a stiffener assembly according to some embodiments of the present invention.
Figure 2A:
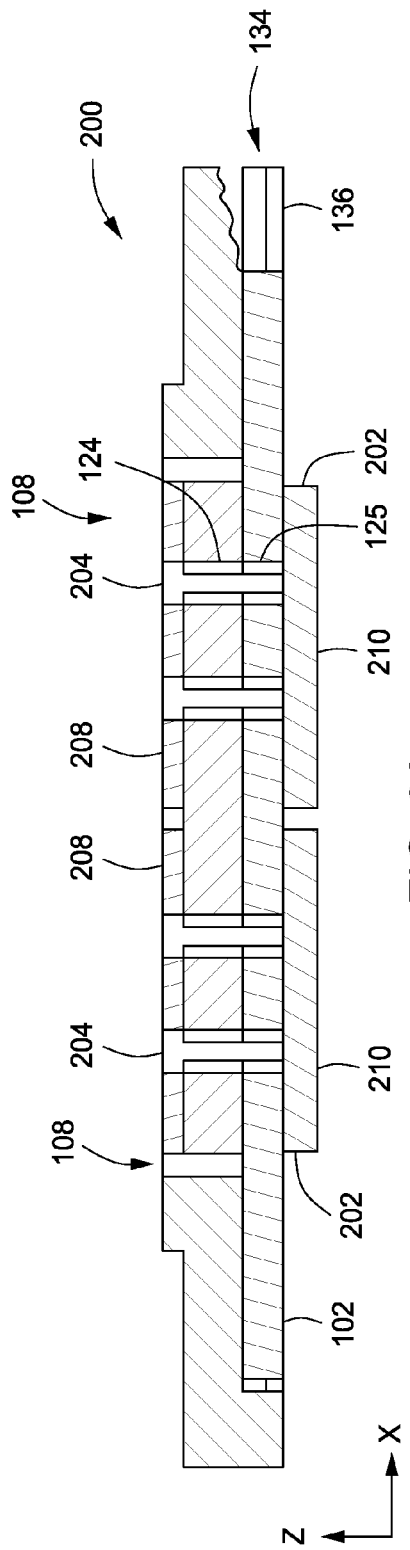
FIG. 2A depicts a schematic side view of a probe card assembly according to some embodiments of the present invention, shown in cutaway corresponding to section lines 2A of the stiffener assembly shown in FIG. 1.
Figure 2B:
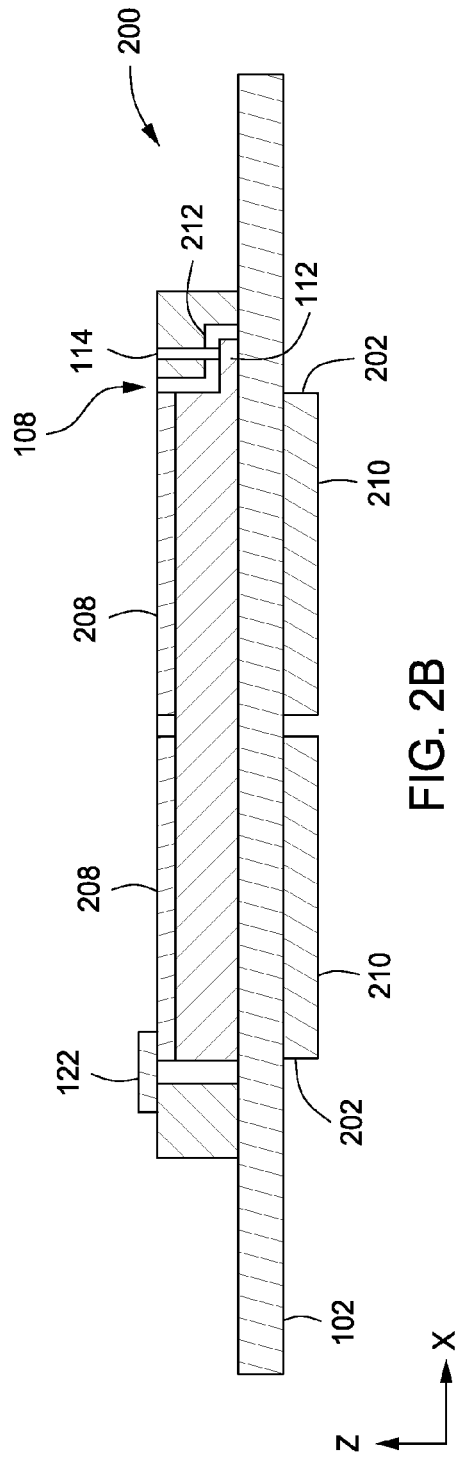
FIG. 2B depicts a schematic side view of a probe card assembly according to some embodiments of the present invention, shown in cutaway corresponding to section lines 2B of the stiffener assembly shown in FIG. 1.

The Figures and following description provided herein illustratively refer to an exemplary Cartesian coordinate system where the x and y axes are substantially parallel to a plane defined by a stiffener assembly and/or probe card assembly incorporating same, and wherein the z axis is substantially normal, or perpendicular, to such a plane. For example, FIG. 1 illustratively depicts a top view of a stiffener assembly in an x-y plane, where the z axis would extend perpendicularly into and out of the page. FIGS. 2A-B illustratively depict side views in an x-z plane.

FIG. 1 depicts a top view of a stiffener assembly 100 according to some embodiments of the present invention. The stiffener assembly 100 is illustratively shown coupled to a substrate 102 to demonstrate an illustrative use of the stiffener assembly 100. The stiffener assembly 100 is further explained with reference to FIGS. 2A-B, respectively depicting schematic side views of the stiffener assembly 100 as illustratively used in a probe card assembly according to some embodiments of the present invention. FIGS. 2A-B are shown in cutaways corresponding to section lines 2A and 2B of the stiffener assembly 100 shown in FIG. 1.

The stiffener assembly 100 generally includes an inner member 104 and an outer member 106. The inner member 104 comprises a body 150 that, in some embodiments, can generally have a size and shape corresponding to one or more probe substrates (such as probe substrates 202 shown in FIGS. 2A-B) disposed beneath the substrate 102. The inner member 104 in some instances may rest directly against the substrate 102. Alternatively, additional layers (not shown) may be disposed between the inner member 104 and the substrate 102. In some embodiments, one or more locating pins (not shown) may be provided to facilitate alignment of the inner member 104 and the substrate 102.

The inner member 104 may comprise any materials suitable to maintain acceptable rigidity of a probe card assembly (as discussed further below with respect to FIG. 4) when subjected to forces utilized in testing (such as forces used to pre-load the stiffener assembly and/or probe card assembly, applied due to varying energy flows through the stiffener assembly and/or probe card assembly, applied to make sufficient electrical contact with the terminals of a DUT, or the like) and to closely match the thermal strain between the stiffener assembly 100 and the substrate 102 to mitigate shear coupling therebetween. Non-limiting examples of suitable materials include metals and metal alloys such as Kovar®, Invar®, steel, stainless steels, or the like. The materials comprising the inner member 104 may further be selected to facilitate a desired rate of heat transfer, or a desired heat capacity for the inner member 104.

In some embodiments, as shown in FIG. 2A, a probe substrate alignment mechanism 206 may be provided to locally adjust both the lateral and the planar alignment of probe substrates 202 disposed beneath the inner member 104. Accordingly, a plurality of openings 124 may be formed through the body 150 of the inner member 104 to facilitate such planar alignment of probe substrates 202. In some embodiments, the probe substrate alignment mechanism 206 may comprise one or more adjuster plates 208 disposed above the inner member 104. Each adjuster plate 208 may be coupled to respective pluralities of planar alignment mechanisms 204 that interface with the probe substrates 202. In some embodiments, the alignment mechanism 204 may be a screw. However, the alignment mechanism 204 may comprise other devices suitable for selectively adjusting planarity of the probe substrates 202. Each planar alignment mechanism 204 passes through a respective opening 124 in the inner member 104 and a corresponding opening 125 in the substrate 102. The openings 124, 125 may have a larger diameter than the planar alignment mechanisms 204 to facilitate lateral movement thereof with respect to the inner member 104 and the substrate 102.

In operation, the adjuster plates 208 may be laterally positioned to control the respective lateral positions of contact elements formed on respective probe surfaces 210 of the probe substrates 202 with respect to the inner member 104 and the substrate 102. Once in a desired position, the adjuster plates 208 may be locked into position, for example, by clamping, bolting, or otherwise securing the adjuster plates 208 to the inner member 104. The planar alignment mechanisms 204 may be individually adjusted to selectively control the planarity of the probe substrates 202 before or after lateral alignment of the probe substrates 202, or both.

Returning to FIG. 1, the outer member 106 generally comprises a body 107 having a central opening 140. The size and shape of the opening 140 can generally correspond to the size and shape of the inner member 104, such that the outer member 106 substantially circumscribes, or surrounds, the inner member 104.

The outer member 106 may be fixedly coupled to the substrate 102 by any suitable mechanism, such as, screws, bolts, clamps, or the like. Alternatively, the outer member 106 may be movably coupled to the substrate 102, such that the substrate 102 is free to expand and contract (e.g., laterally) with respect to the stiffener assembly 100. In some embodiments, a plurality of arms 126 may extend outwardly from the body 107 of the outer member 106 to facilitate stiffening regions 128 of the substrate 102 that are disposed radially outwards of the body 107. The outwardly extending arms 126 may be formed integrally with the body 107 or may be affixed thereto in any suitable manner able to withstand the forces generated during use. In the embodiment depicted in FIG. 1, four such outwardly extending arms 126 are depicted. It is contemplated that greater or fewer arms 126 may be provided. In some embodiments, the outer member 106 can be mechanically coupled to a tester (not shown), e.g., via a plurality of the arms 126.

The outwardly extending arms 126 may facilitate stiffening of the substrate 102 to restrict non-planar deflection thereof, while at the same time facilitating lateral movement between the stiffener assembly 100 and the substrate 102. For example, in some embodiments, each arm 126 may further include an extension 130 having a flange 132 extending therefrom (shown through illustrative cutaway 138 in the substrate 102) designed to interface with a slot 134 and corresponding shelf 136 formed in the substrate 102 (revealed via illustrative cutaway 142). Interference between the flange 132 and the shelf 136 restricts deflection of the substrate 102, thereby providing added stability and/or rigidity to the substrate 102 in the regions 128 disposed radially outwards of the body 107 of the outer member 106. However, co-planar, lateral (e.g., radial) movement of the stiffener assembly 100 with respect to the substrate 102 may still occur due to slippage between the flange 132 and the shelf 136.

Figure 3:
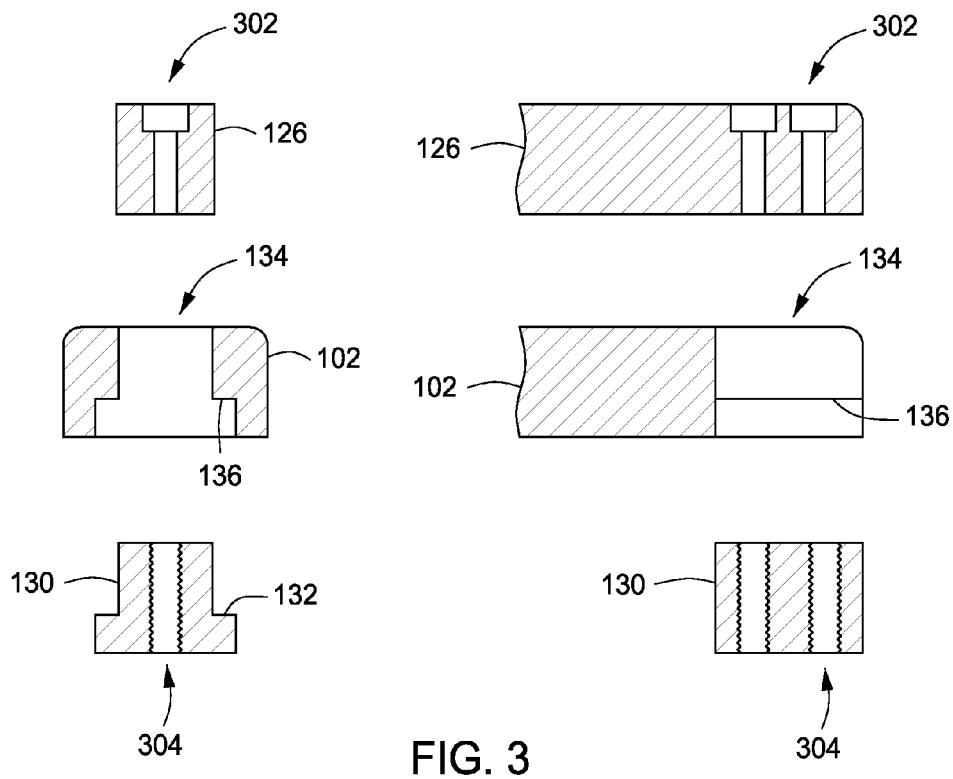
FIG. 3 depicts an exploded front and side view of a portion of the stiffener assembly of FIG. 1 in accordance with some embodiments of the present invention.

In some embodiments—for example, to facilitate construction of the stiffener assembly 100 with a substrate as used in a probe card assembly—the outwardly extending arms 126 and the extensions 130 may be separate components that may be suitably coupled together. Accordingly, one or more mechanisms, such as a screw, may be utilized to couple the outwardly extending arms 126 to the respective extensions 130. For example, in the embodiment depicted in FIG. 3, two holes 302 are provided in the outwardly extending arms 126. Corresponding holes 304 are provided in the extension 130 to facilitate using screws (not shown) to couple the outwardly extending arms 126 to the extensions 130. In some embodiments, the dimensions of the extension 130 and flange 132 relative to the slot 134 and shelf 136 formed in the substrate 102 may be selected to facilitate slideable coupling therebetween, thereby allowing lateral movement between the outwardly extending arms 126 and the substrate 102.

Returning to FIG. 1, the outer member 106 may comprise any materials suitable to maintain acceptable rigidity of a probe card assembly (as discussed further below with respect to FIG. 4) when subjected to forces utilized in testing (such as forces used to pre-load the stiffener assembly and/or probe card assembly, applied due to varying energy flows through the stiffener assembly and/or probe card assembly, applied to make sufficient electrical contact with the terminals of a DUT, or the like) and to closely match the thermal strain between the stiffener assembly 100 and the substrate 102 to mitigate shear coupling therebetween. Non-limiting examples of suitable materials include metals and metal alloys such as Kovar®, Invar®, steel, stainless steels, metal matrix composites, ceramics, cerments, or the like. The materials comprising the outer member 106 may further be selected to facilitate a desired rate of heat transfer, or a desired heat capacity for the outer member 106.

The inner and outer members 104, 106 may comprise the same or different materials. Moreover, the materials comprising the inner and outer members 104, 106 may advantageously be selected to provide similar or different thermal characteristics to the inner and outer members 104, 106. For example, in some embodiments, the inner member 104 may have a low heat capacity and/or a high heat transfer rate to facilitate rapid heating of the inner member 104 to process temperatures during testing. In some embodiments, the outer member 106 may have a high heat capacity and/or a low heat transfer rate to facilitate preventing heat from flowing out of the inner member 104 through the outer member 106. It is contemplated that the thermal characteristics of the inner and outer members 104, 106 may be reversed from the above description depending upon the specific application.

A gap 108 may be maintained between the inner and outer members 104, 106, such that the members are disposed in a predominantly spaced apart relation with respect to each other. The gap 108 can restrict conductive heat transfer between the inner and outer members 104, 106, thereby facilitating greater control over the desired thermal characteristics of the stiffener assembly 100.

A plurality of alignment mechanisms 110 may be provided for orienting the inner and outer members 104, 106 with respect to each other. In the embodiment depicted in FIG. 1, three such alignment mechanisms 110 are shown. It is contemplated that greater or fewer alignment mechanisms may be provided. Each alignment mechanism 110 may be additionally utilized to transfer forces applied to a lower surface of the inner member 104 to the outer member 106 (for example, when contacting a DUT with contact elements of the probe substrate 202). Furthermore, the plurality of alignment mechanisms 110 may provide the predominant conductive heat transfer passageway between the inner and outer members 104, 106 due to the maintenance of the gap 108 therebetween. By utilizing such alignment mechanisms 110 to position the inner and outer members 104, 106 with respect to each other while providing the gap 108 therebetween, the stiffener assembly 100 is advantageously strongly mechanically coupled (thereby facilitating stiffening of a substrate or probe card assembly in which the stiffener assembly 100 is being used), and at the same time loosely thermally coupled (thereby facilitating reduced heat ramp-up, or soak, times required to reach steady state prior to testing).

In some embodiments, the alignment mechanism 110 may comprise a protrusion extending from one of the inner or outer members 104, 106 that interfaces with a recess formed in the other of the inner or outer members 104, 106, and an actuator for controlling the relative distance between the inner and outer members 104, 106 at the location of the alignment mechanism 110. For example, in the illustrative embodiments shown in FIGS. 1 and 2B, a protrusion 112 extends from the inner member 104 into a recess 212 provided in the outer member 106. The protrusion 112 and the recess 212 are sized to maintain the gap 108 between the inner and outer members 104, 106. An actuator 114 extends between the inner and outer members 104, 106 and may be used to selectively control the distance therebetween, thereby selectively controlling the relative positions of the inner and outer members 104, 106. In combination with other alignment mechanisms 110 disposed about the stiffener assembly 110, the alignment mechanisms 110 may control the planar alignment between the inner and outer members 104, 106, thereby advantageously controlling the planar alignment of the probe substrates 202 while maintaining rigid support of the substrate 102. In some embodiments, the actuator 114 may be a screw, such as a set screw. Alternatively, other actuatable mechanisms may be utilized.

In some embodiments, a plurality of lateral alignment mechanisms 116 may be provided to facilitate lateral alignment of the inner and outer members 104, 106 and/or provide additional transfer of forces from the inner member 104 to the outer member 106. In the embodiment depicted in FIG. 1, six such lateral alignment mechanisms 116 are provided. It is contemplated that greater or fewer lateral alignment mechanisms 116 may be provided. In some embodiments, the lateral alignment mechanism 116 may comprise a protrusion 118 extending into a recess similarly described above with respect to alignment mechanism 110. Optionally, an actuatable mechanism 120, such as a set screw, may further be provided to assist in restricting lateral movement and/or deflection of the inner member 104 with respect to the outer member 106. The actuatable mechanism 120 provides minimal additional points of conductive thermal transfer between the inner and outer members 104, 106, thereby maintaining the low rate of conductive thermal transfer therebetween.

Optionally, one or more flexures 122 may be provided for upwardly biasing the inner member 104 with respect to the outer member 106. The flexures 122 may additionally provide additional x-y rigidity to the stiffener assembly 100 as well as z-compliance. The flexures 122 provide low conductive thermal transfer rates between the inner and outer members 104, 106, due to the small cross sectional area of the flexure, thereby maintaining the low rate of conductive thermal transfer between the inner and outer members 104, 106. The heat transfer between the stiffener members may be further controlled by selection of the material properties of the flexures 122. Although three flexures 122 are shown in FIG. 1, greater or fewer flexures may be provided. Furthermore, although the flexures 122 are illustrated generally as rectangular (as viewed looking toward FIG. 1), they could be other shapes as well.

Figure 4:
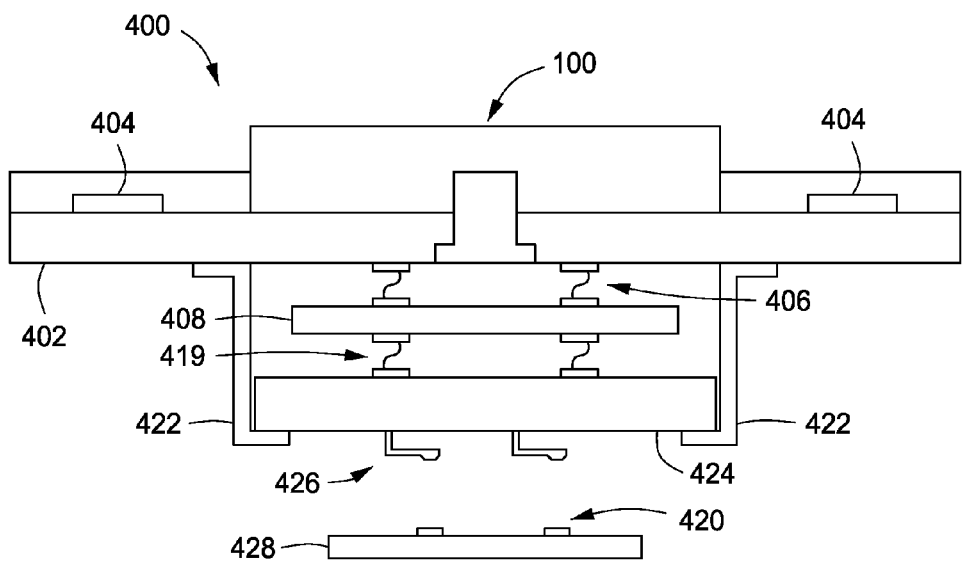
FIG. 4 depicts a probe card assembly having a stiffener assembly in accordance with some embodiments of the present invention.

FIG. 4 depicts a probe card assembly 400 utilizing a stiffener assembly 100 according to some embodiments of the present invention. The exemplary probe card assembly 400 illustrated in FIG. 4 can be used to test one or more electronic devices (represented by DUT 428). The DUT 428 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, refers to one or a plurality of such electronic devices.

The probe card assembly 400 generally acts as an interface between a tester (not shown) and the DUT 428. The tester, which can be a computer or a computer system, typically controls testing of the DUT 428, for example, by generating test data to be input into the DUT 428, and receiving and evaluating response data generated by the DUT 428 in response to the test data. The probe card assembly 400 includes electrical connectors 404 configured to make electrical connections with a plurality of communications channels (not shown) from the tester. The probe card assembly 400 also includes one or more resilient contact elements 426 configured to be pressed against, and thus make temporary electrical connections with, one or more input and/or output terminals 420 of DUT 428. The resilient contact elements 426 are typically configured to correspond to the terminals 420 of the DUT 428 and may be arranged in one or more arrays having a desired geometry.

The probe card assembly 400 may include one or more substrates configured to support the connectors 404 and the resilient contact elements 426 and to provide electrical connections therebetween. The exemplary probe card assembly 400 shown in FIG. 4 has three such substrates, although in other implementations, the probe card assembly 400 can have more or fewer substrates. In the embodiment depicted in FIG. 4, the probe card assembly 400 includes a wiring substrate 402, an interposer substrate 408, and a probe substrate 424. The wiring substrate 402, the interposer substrate 408, and the probe substrate 424 can generally be made of any type of suitable material or materials, such as, without limitation, printed circuit boards, ceramics, organic or inorganic materials, and the like, or combinations thereof. As shown in FIG. 4, the stiffener assembly 100 may be coupled to the wiring substrate 402. The stiffener assembly 100 may be utilized, as described above, to maintain the respective tips of the resilient contact elements in a configuration, or topography, within a pre-defined tolerance of a corresponding topography of the respective top surfaces of the terminals 420 of the DUT 428. In some embodiments the tolerance is within 30 microns. In some embodiments, the topography is substantially planar. In some embodiments, the topography may be non-planar.

Electrically conductive paths (not shown) are typically provided from the connectors 404 through the various substrates to the resilient contact elements 426 and components 430. For example, in the embodiment depicted in FIG. 4, electrically conductive paths (not shown) may be provided from the connectors 404 through the wiring substrate 402 to a plurality of electrically conductive spring interconnect structures 406. Other electrically conductive paths (not shown) may be provided from the spring interconnect structures 406 through the interposer substrate 408 to a plurality of electrically conductive spring interconnect structures 419. Still other electrically conductive paths (not shown) may further be provided from the spring interconnect structures 419 through the probe substrate 424 to the resilient contact elements 426. The electrically conductive paths through the wiring substrate 402, the interposer substrate 408, and the probe substrate 424 can comprise electrically conductive vias, traces, or the like, that may be disposed on, within, and/or through the wiring substrate 402, the interposer substrate 408, and the probe substrate 424.

The wiring substrate 402, the interposer substrate 408, and the probe substrate 424 may be held together by one or more brackets 422 and/or other suitable means (such as by bolts, screws, or other suitable fasteners). The configuration of the probe card assembly 400 shown in FIG. 4 is exemplary only and is simplified for ease of illustration and discussion and many variations, modifications, and additions are contemplated. For example, a probe card assembly may have fewer or more substrates (e.g., 402, 408, 424) than the probe card assembly 400 shown in FIG. 4. As another example, a probe card assembly may have more than one probe substrate (e.g., 424), and each such probe substrate may be independently adjustable (as described above with respect to FIGS. 1-2). Other non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 400 shown in FIG. 4 and that the probe card assemblies described in the aforementioned patents and application may benefit from the use of the inventive stiffener assembly disclosed herein.

Typically, the inner and outer members of the stiffener assembly 100 may be aligned relative to each other, as described above, to provide an initial planar and/or lateral orientation of the probe substrates 424 and/or resilient contact elements 426 disposed thereon during an initial assembly of the probe card assembly 400. In addition, the inner and outer members of the stiffener assembly 100 may further be moved relative to each other for further planar and/or lateral adjustment, for example, after the probe card assembly 400 is installed in a particular testing apparatus to compensate for planarity and/or lateral positional variations in particular probers/testers being utilized and/or particular DUTs being tested.

In operation, the resilient contact elements 426 are brought into contact with the terminals 420 of the DUT 428 by moving at least one of the DUT 428 or the probe card assembly 400. Typically, the DUT 428 can be disposed on a movable support disposed in the test system (not shown) that moves the DUT 428 into sufficient contact with the resilient contact elements 426 to provide reliable electrical contact with the terminals 420. The DUT 428 can then tested per a pre-determined protocol as contained in the memory of the tester. For example, the tester may generate power and test signals that are provided through the probe card assembly 400 to the DUT 428. Response signals generated by the DUT 428 in response to the test signals are similarly carried through the probe card assembly 400 to the tester, which may then analyze the response signals and determine whether the DUT 428 responded correctly to the test signals. Typically, the DUT 428 is tested at an elevated temperature (for example, up to 250 degrees Celsius for wafer level burn in). Accordingly, the probe card assembly 450 is typically preheated to a temperature equal to or within a given tolerance of the testing temperature. The stiffener assembly 100 of the present invention facilitates rapid heating times due to the reduced thermal mass of the stiffener assembly that is required to be heated (e.g., the inner member).

When moving the DUT 428 to contact the resilient contact elements 426 of the probe card assembly 400, the DUT 428 typically continues to move towards the probe card assembly 400 until all of the resilient contact elements 426 come into sufficient contact with the terminals 420. Due to one or both of the non-planarity of the respective tips of the resilient contact elements 426 disposed on the probe card assembly 400 and the variations of the heights of the terminals 420, the DUT 428 may continue to move towards the probe card assembly 400 for an additional non-limiting exemplary range of about 1-4 mils (about 25.4-102 μm) after the initial contact of the first resilient contact element 426 to contact the DUT 428 (sometimes referred to as overtravel). The actual amount of overtravel depends on the characteristics of the non-planarity of the respective tips of the resilient contact elements 426 and/or the variations in height of the terminals 420. Accordingly, some of the resilient contact elements 426 may undergo more deflection than others. However, the overtravel requirement imparts forces to the probe substrate 424 that are transferred to the wiring substrate 402. The stiffener assembly 100 facilitates restricting any bending, or deflection of the wiring substrate 402 that may undesirably cause the positions of the tips of the contact elements 426 to move and possibly lose contact with the terminals 420 of the DUT 428.

Figure 5:
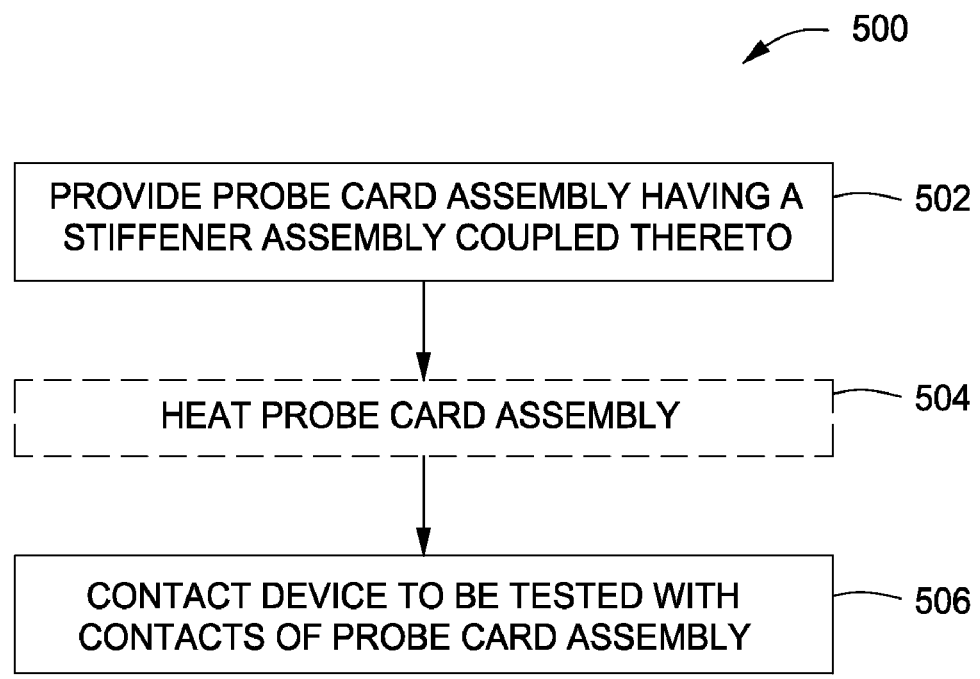
FIG. 5 depicts a flow chart for testing a substrate in accordance with some embodiments of the present invention.

For example, FIG. 5 depicts a process 500 for testing a semiconductor device, or DUT, utilizing a probe card assembly 400 as described above with respect to FIG. 4 according to some embodiments of the invention. The exemplary process 500 begins at 502, where a probe card assembly 400 is provided having a stiffener assembly 100 coupled thereto. Typically, a plane of the inner member 104 of the stiffener assembly 100 may be adjusted relative to a plane of the outer member 106 via alignment mechanisms 110. In addition, the inner member 104 may be laterally adjusted relative to the outer member 106 and/or the probe substrates 424 may be laterally adjusted, as discussed above. Optionally, at 504, the probe card assembly 400 may be heated. Next, at 506, a device to be tested may be brought into contact with respective tips of the resilient contact elements 426 of the probe card assembly 400.

Thus, a stiffener assembly and probe card assembly incorporating the same have been provided herein. The stiffener assembly comprises components that are strongly mechanically and loosely thermally coupled, thereby advantageously providing stiffening of a substrate in use with a probe card assembly while minimizing heat transfer between stiffener assembly components. The minimized heat transfer between stiffener assembly components facilitates minimizing the thermal mass of the stiffener assembly that must be heated during testing, thereby reducing heating times to bring the stiffener assembly up to temperature.

While the foregoing is directed to embodiments of the present invention, other and further embodiments of the invention may be devised without departing from the basic scope thereof, and the scope thereof is determined by the claims that follow.

The invention claimed is:

1. A stiffener for use with testing devices, comprising:
   an inner member;
   an outer member having an opening, the inner member disposed at least partially within the opening and disposed in a predominantly spaced apart relation to the outer member, the inner and outer members configured to be disposed above a substrate to be stiffened; and
   a plurality of alignment mechanisms for orienting the inner and outer members with respect to each other, wherein the alignment mechanisms transfer forces applied to a lower surface of the inner member to the outer member and provide the predominant conductive heat transfer passageway between the inner and outer members.

2. The stiffener of claim 1, wherein the alignment mechanisms further comprise:
   a recess formed in one of the inner or outer member and a protrusion formed on the other one of the inner or outer member and configured to extend into the recess without contacting inner surfaces of the recess; and
   an actuator having an element extending between the protrusion and a wall of the recess for selectively controlling a vertical displacement between the protrusion and the wall.

3. The stiffener of claim 2, wherein the actuator comprises a screw.

4. The stiffener of claim 1, wherein a rate of conductive heat transfer to the outer member is different than a rate of conductive heat transfer to the inner member.

5. The stiffener of claim 1, wherein the outer member comprises a material having a different thermal resistivity than the inner member.

6. The stiffener of claim 1, further comprising:
   one or more flexures disposed between the inner and outer members for upwardly biasing the inner member with respect to the outer member.

7. The stiffener of claim 1, further comprising:
   one or more flexures disposed between the inner and outer members for providing lateral stiffness in a plane common to the inner member and the outer member.

8. The stiffener of claim 1, wherein the outer member further comprises:
   a body; and
   a plurality of arms extending outwardly from the body and configured to interface with a substrate larger than the body.

9. A stiffener for use with testing devices, comprising:
   an inner member and an outer member configured to be disposed above a substrate to be stiffened, the inner member at least partially disposed in an opening in the outer member, the inner and outer members disposed in a predominantly spaced apart relation, the inner and outer members moveable with respect to each other and coupled together via a plurality of alignment mechanisms that transfer forces applied to lower surfaces of the inner member to the outer member and provide the predominant conductive heat transfer passageway between the inner and outer members.

10. A probe card assembly, comprising:
   a substrate having an upper surface and an opposing lower surface; and
   a stiffener, comprising:
      an inner member;
      an outer member moveably coupled to the substrate and disposed at least partially about the inner member in a predominantly spaced apart relation thereto; and
      a plurality of alignment mechanisms for orienting the inner and outer members with respect to each other, wherein the alignment mechanisms transfer forces applied to a lower surface of the inner member to the outer member and provide the predominant conductive heat transfer passageway between the inner and outer members.

11. The probe card assembly of claim 10, wherein the alignment mechanisms further comprise:

a recess formed in one of the inner or outer member and a protrusion formed on the other one of the inner or outer member and configured to extend into the recess without contacting inner surfaces of the recess; and an actuator having an element extending between the protrusion and a wall of the recess for selectively controlling a vertical displacement between the protrusion and the wall.

12. The probe card assembly of claim 11, wherein the actuator comprises a screw.

13. The probe card assembly of claim 10, wherein a rate of conductive heat transfer to the outer member is different than a rate of conductive heat transfer to the inner member.

14. The probe card assembly of claim 10, wherein the outer member comprises a material having a different thermal resistivity than the inner member.

15. The probe card assembly of claim 10, further comprising:

one or more flexures disposed between the inner and outer members for downwardly biasing the inner member with respect to the outer member.

16. The probe card assembly of claim 10, wherein the outer member further comprises:

a plurality of outwardly extending arms configured to restrict bending of the substrate while allowing lateral movement between the arms and the substrate.

17. The probe card assembly of claim 10, wherein at least one probe substrate is disposed predominantly beneath the inner member.

18. A method of using a probe card assembly, comprising:

providing a probe card assembly having a stiffener assembly coupled thereto, the stiffener assembly comprising an inner member and an outer member disposed above a substrate to be stiffened, the inner member at least partially disposed in an opening in the outer member, the inner and outer members disposed in a predominantly spaced apart relation, the inner and outer members moveable with respect to each other and coupled together via a plurality of alignment mechanisms that transfer forces applied to lower surfaces of the inner member to the outer member and provide the predominant conductive heat transfer passageway between the inner and outer members; and adjusting a plane of the inner member relative to a plane of the outer member via the alignment mechanisms.

19. The method of claim 18, further comprising:

heating the probe card assembly.

20. The method of claim 18, further comprising:

providing one or more electrical signals to at least one terminal of the device to be tested through the probe card assembly.

21. The method of claim 18, further comprising:

contacting a device to be tested with a plurality of contacts of the probe card assembly.

* * * * *